(12) United States Patent
Beck

(10) Patent No.: US 7,608,873 B2
(45) Date of Patent: Oct. 27, 2009

(54) BURIED-GATED PHOTODIODE DEVICE AND METHOD FOR CONFIGURING AND OPERATING SAME

(75) Inventor: Jeffery S. Beck, Philomath, OR (US)

(73) Assignee: Aptina Imaging Corporation, Grand Cayman (KY)

( * ) Notice: Subject to any disclaimer, the term of this patent is extended or adjusted under 35 U.S.C. 154(b) by 318 days.

(21) Appl. No.: 11/412,280

(22) Filed: Apr. 27, 2006

(65) Prior Publication Data

US 2007/0252182 A1 Nov. 1, 2007

(51) Int. Cl.
*H01L 31/062* (2006.01)
*H01L 31/113* (2006.01)
*H01L 27/00* (2006.01)
*H01L 31/00* (2006.01)
*H01L 21/336* (2006.01)

(52) U.S. Cl. .................. 257/292; 257/369; 250/208.1; 250/214.1; 438/302; 438/307; 438/308

(58) Field of Classification Search ............. 250/208.1, 250/214.1; 257/292, 369; 438/302, 307, 438/308
See application file for complete search history.

(56) References Cited

U.S. PATENT DOCUMENTS

| 6,107,655 | A | 8/2000 | Guidash | |
|---|---|---|---|---|
| 6,160,281 | A | 12/2000 | Guidash | |
| 6,352,869 | B1 | 3/2002 | Guidash | |
| 6,423,994 | B1 | 7/2002 | Guidash | |
| 6,552,323 | B2 | 4/2003 | Guidash | |
| 6,657,665 | B1 | 12/2003 | Guidash | |
| 2004/0217426 | A1* | 11/2004 | Lee | ............................ 257/369 |
| 2006/0138489 | A1* | 6/2006 | Ahn et al. | .................... 257/292 |
| 2006/0249653 | A1* | 11/2006 | Gazeley | .................. 250/208.1 |

* cited by examiner

*Primary Examiner*—Steven Loke
*Assistant Examiner*—Arman Khosraviani
(74) *Attorney, Agent, or Firm*—Ratner Prestia

(57) ABSTRACT

A 3-T buried-gated photodiode device that is suitable for use in a windowed array. The 3-T buried-gated photodiode device is configured such that the floating diffusion (FD) node of the device is held low when the device is not being specifically addressed, which ensures that the device cannot drive the corresponding pixel output line unless it is specifically addressed.

13 Claims, 4 Drawing Sheets

BURIED-GATED PHOTODIODE DEVICE AND METHOD FOR CONFIGURING AND OPERATING SAME

TECHNICAL FIELD OF THE INVENTION

The invention relates to photodiode devices formed in integrated circuits (ICs). More particularly, the invention relates to a buried-gated photodiode device that actively holds the floating diffusion (FD) node low except when it is being specifically addressed. This ensures that the photodiode device will not drive the associated pixel output line except when the device is being specifically addressed.

BACKGROUND OF THE INVENTION

Known 3-transistor (3-T) buried-gated photodiode devices, often referred to as 3-T pinned photodiode devices, are normally not suitable for use in windowed arrays due to the fact that the electrical charge on the floating diffusion (FD) node of the photodiode device can vary, i.e., float. This feature of the 3-T pinned photodiode device makes it unsuitable for use as a pixel in a windowed array because the floating nature of the FD node can result in a non-addressed pixel inadvertently driving the pixel output line connected to the pixel.

FIG. 1 illustrates a schematic diagram of a known 3-T buried-gated photodiode device 2, which is commonly referred to as a pixel. The pixel 2 includes a photodiode 3, a transfer transistor 4, a reset transistor 5, and a source follower (SF) transistor 6. The source of the reset transistor 5 is tied to the FD node 7 of the photodiode device 2. The drain of the reset transistor 5 is tied to a line called pixel $V_{DD}$ ($PV_{DD}$). The $PV_{DD}$ line 13 is tied to a pixel output line 14, which includes a switch 8, labeled $FD_{LOW}$ bar, and to a switch 9, labeled $FD_{LOW}$. $FD_{LOW}$ bar is $FD_{LOW}$ inverted. The source of the SF transistor 6 is tied to an output terminal 12, which is tied to a current source 11. The current source 11 is tied to ground. The drain of the SF transistor 6 is tied to the $PV_{DD}$ line 13. The pixel 2 operates as follows. When the pixel 2 is in an exposure reset period, the switch $FD_{LOW}$ bar 8 is closed (i.e., asserted), which conductively connects line $PV_{DD}$ to $V_{DD}$. The reset signal (RS) of the reset transistor 5 is toggled from low to high to low, which activates the reset transistor 5 and causes the FD node 7 to charge to $V_{DD}$. The transfer signal, TX, received at the gate of the transfer transistor 4 is then toggled from low to high to low, which causes the photodiode 3 to be set to the fully depleted photodiode voltage. An integration period then occurs during which photons strike the photodiode 3 causing electrical charge to accumulate on the photodiode 3.

At the end of the integration period, an FD reset period occurs. While the $FD_{LOW}$ bar switch 8 remains closed, the reset signal RS is again toggled from low to high to low, which activates the reset transistor 5 and causes the FD node 7 to charge to $V_{DD}$. Just before the end of the settle period, the voltage on output line 12 is read by a sample-and-hold (S/H) circuit (not shown). This sampled value is called the reset read value.

At the end of the first settle period (after the reset read value has been sampled) a transfer period occurs during which the TX signal is again toggled from low to high to low. This causes the charge on the photodiode 3 to be transferred from the photodiode 3 to the FD node 7. A settle period then occurs to allow the output line 12 to settle to its steady state value. Just before the end of the settle period, the value on the output line 12 is sampled by the S/H circuit. This sampled value is called the video read value.

At the end of the second settle period (after the video read value has been sampled), the $FD_{LOW}$ switch 9 is closed ($FD_{LOW}$ bar switch 8 is opened), which causes the $PV_{DD}$ line to be pulled down nearly to ground. The reset signal RS is asserted, which activates the reset transistor 5 and causes the FD node 7 to be pulled down to ground. Just before the FDLOW switch 9 is opened, the reset signal RS is deasserted, which deactivates the reset transistor 5, thereby causing the low value to be stored on the FD node 7. The FDLOW switch 9 is then opened (FDLOW bar switch 8 is closed), which pulls the $PV_{DD}$ line up to $V_{DD}$.

The low voltage (ground or nearly ground) stored on the FD node 7 is intended to remain low whenever the pixel 2 is not being addressed. However, because the voltage stored on the FD node 9 tends to float, it is possible for that voltage to increase to a level that is sufficient to turn on the SF transistor 6. This would produce a voltage on output line 12, which, in a windowed array, is part of the pixel output line. If this happens at a time when another pixel in the same column is being addressed, the sampled value of that pixel will be corrupted. For this reason, 3-T pinned photodiode devices normally are not used in windowed arrays.

Pixels in windowed arrays typically are 4-T buried-gated (or pinned) photodiode devices. These pixels have additional transistors that ensure that a pixel is not driving the pixel output line unless the pixel is being addressed. However, the additional transistors and the corresponding additional control lines consume additional area on the IC, which leaves less area for the photodiode. It would be desirable to be able to use a 3-T burried-gated photodiode devices in a windowed array so that less area is needed for transistors and control lines, leaving more area for the photodiode.

SUMMARY OF THE INVENTION

The invention provides a pinned photodiode device that is configured to ensure that it cannot drive a pixel output line to which it is connected unless it is specifically being addressed. The photodiode device comprises a source follower (SF) transistor, a reset transistor, a transfer (TX) transistor, and a photodiode. The SF transistor has first and second terminals and a gate terminal. The first terminal is electrically coupled to a power supply and the second terminal is electrically coupled to the pixel output line. The gate terminal is electrically coupled to a floating diffusion (FD) node of the device. The reset transistor has a first terminal that is electrically coupled to the FD node and a second terminal that is electrically coupled to a select (SEL) terminal that receives a SEL timing signal. The gate terminal of the reset transistor is electrically coupled to the second terminal of the SF transistor. The TX transistor has a first terminal that is electrically coupled to the FD node and a second terminal that is electrically coupled to the cathode of the photodiode. The anode of the photodiode is electrically coupled to ground. The gate terminal of the TX transistor is electrically coupled to a TX terminal that receives a TX timing signal.

In accordance with another embodiment, multiple pixels share the SF and reset transistors and are connected to the same FD node. In accordance with this embodiment, the IC further includes at least a second transfer (TX2) transistor and a second photodiode. The first terminal of the TX2 transistor is electrically coupled to the FD node and the second terminal of the TX2 transistor is electrically coupled to the cathode of the second photodiode. The gate terminal of the TX2 transistor receives a TX2 timing signal. The TX1 and TX2 timing signals are time division multiplexed.

The invention also provides a method of configuring a photodiode device in a pixel array of an IC. The method comprises, electrically coupling a first terminal of a source follower (SF) transistor of the photodiode device to a pixel output line of the array, electrically coupling a gate terminal of the SF transistor to a floating diffusion (FD) node of the photodiode device, electrically coupling a second terminal of the SF transistor to a power supply of the IC, electrically coupling a first terminal of a reset transistor of the photodiode device to a select (SEL) timing signal terminal that receives a SEL timing signal, electrically coupling a second terminal of the reset transistor to the FD node of the photodiode device, electrically coupling a gate terminal of the reset transistor to the first terminal of the SF transistor, electrically coupling a first terminal of a transfer (TX) transistor of the photodiode device to the FD node, electrically coupling a gate terminal of the TX transistor to a TX timing signal, electrically coupling a second terminal of the TX transistor to a cathode terminal of a photodiode, and electrically coupling an anode of the photodiode to ground.

These and other features and advantages of the invention will become apparent from the following description, drawings and claims.

DETAILED DESCRIPTION OF AN EXEMPLARY EMBODIMENT

Figure 1:
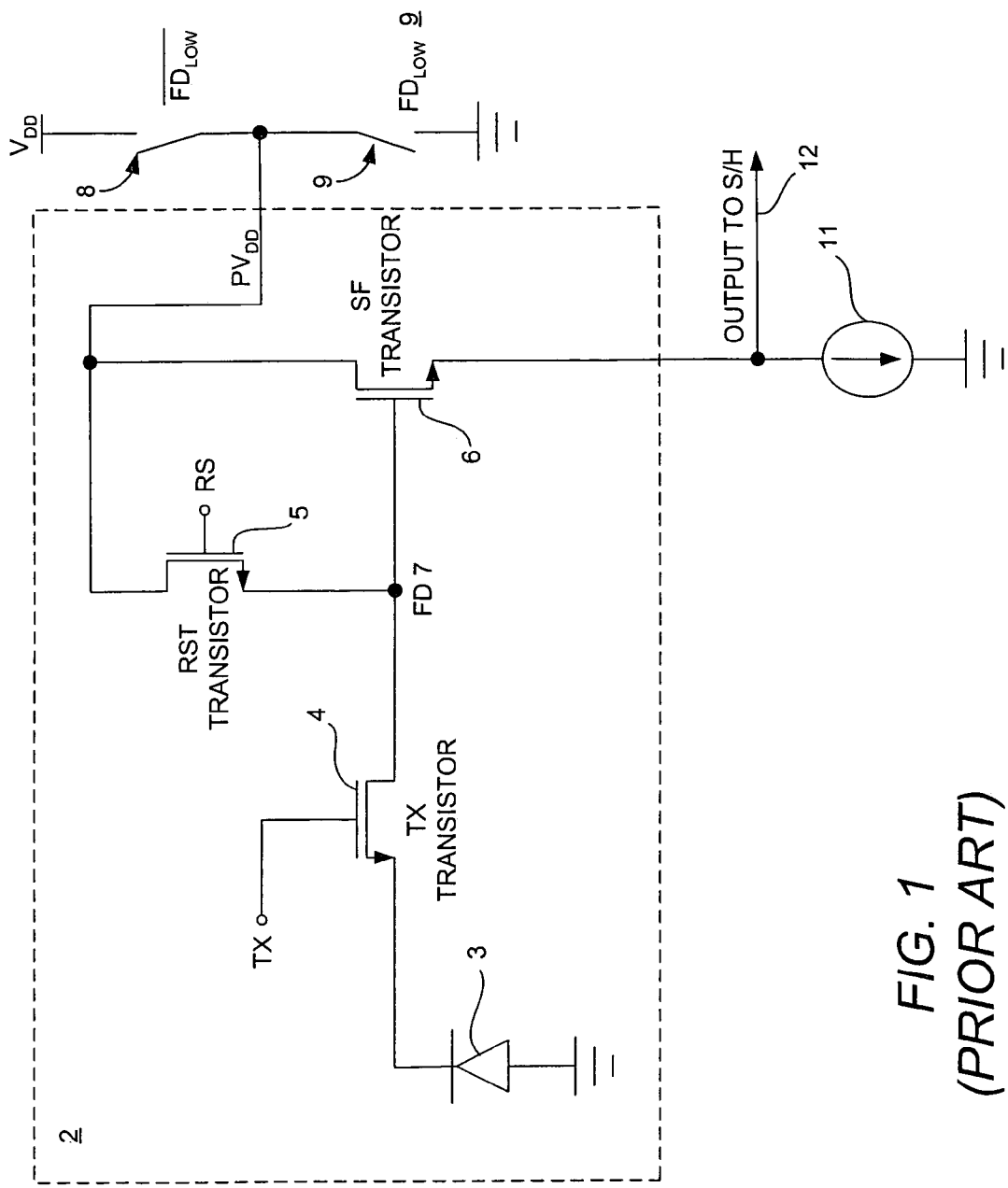
FIG. 1 illustrates a schematic diagram of a known 3-T pinned photodiode device.
Figure 2:
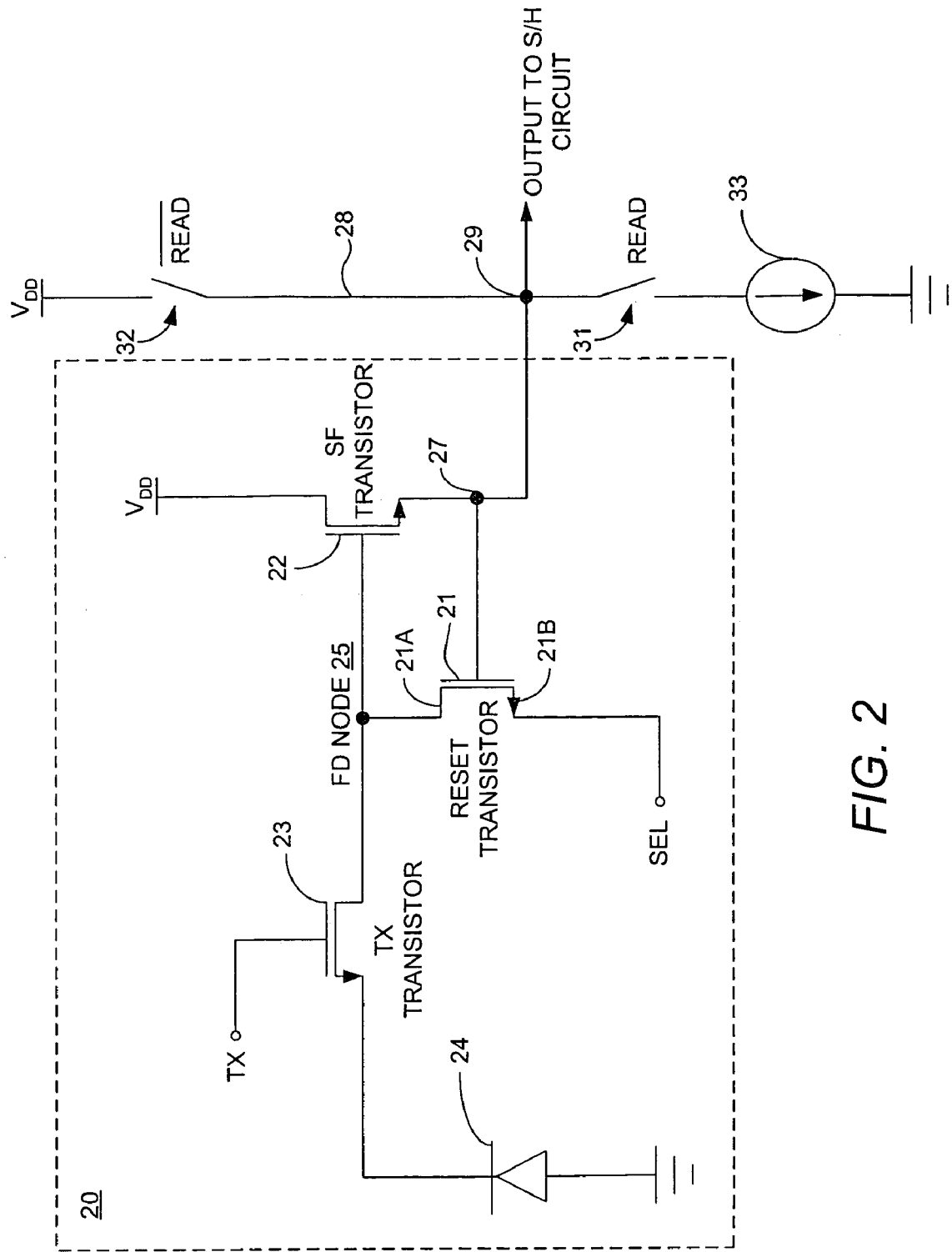
FIG. 2 illustrates a schematic diagram of a 3-T pinned photodiode device (pixel) 20 of the invention in accordance with an exemplary embodiment.

FIG. 2 illustrates a schematic diagram of a 3-T buried-gated photodiode device (pixel) 20 of the invention in accordance with an exemplary embodiment. The pixel 20 is suitable for use in a windowed array because it is configured such that it cannot drive the corresponding pixel output line unless it is specifically addressed. This is accomplished by holding low the FD nodes of all of the non-addressed (deselected) pixels in the array. With reference to FIG. 2, the pixel 20 includes a reset transistor 21, a source follower (SF) transistor 22, a transfer transistor 23, and a photodiode 24. The reset transistor 21 has a terminal 21A tied to the FD node 25 and a terminal 21B tied to a select signal, SEL. As described below with reference to the operations of the pixel 20, in the reset and read mode of operations, the terminal 21A is the source of the reset transistor 21 and terminal 21B is the drain of the reset transistor 21. In the integration mode of operations, the terminal 21A is the drain of the reset transistor 21 and terminal 21B is the source of the reset transistor 21.

The gate of the reset transistor 21 is tied to the source of the SF transistor 22 at node 27, which is tied to the pixel output line 28 at output node 29. The output node 29 provides the signal that is sampled by the S/H circuit (not shown). As will become apparent from the description below, use of the SEL signal and the coupling of the gate of the reset transistor 21 to the source of the SF transistor 22 and to the pixel output line 28 ensures that the FD node 25 will not float to a voltage level that will activate the SF transistor 22 and cause the pixel 20 to drive the pixel output line 28.

Figure 3:
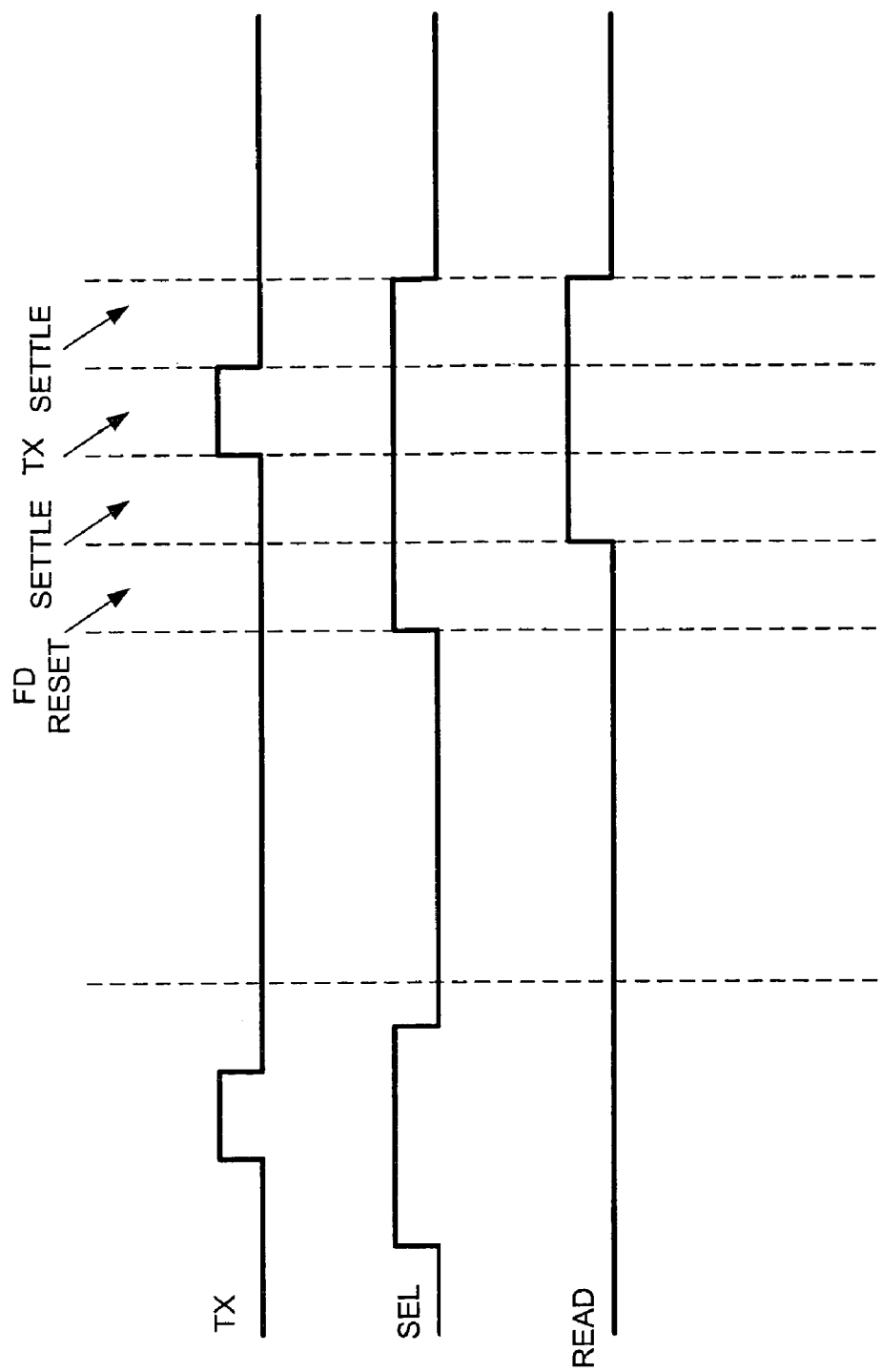
FIG. 3 illustrates a timing diagram that demonstrates the manner in which the pixel shown in FIG. 2 operates.

FIG. 3 illustrates a timing diagram that demonstrates the manner in which the pixel operates during the reset and read modes. The operations of the pixel 20 will now be described with reference to FIGS. 2 and 3. Operations start with an exposure reset period, which sets the photodiode 3 up to the fully depleted photodiode voltage. The Read signal is deasserted and the Read bar signal is asserted, so switch 31 is opened and switch 32 is closed. This pulls node 27 up to $V_{DD}$.

The SEL signal is then asserted (set to $V_{DD}$). When pixel output line 28 and SEL are at $V_{DD}$, the reset transistor 21 becomes conductive, which causes the FD node. 25 to be charged by SEL up to VDD. The TX signal received at the gate of transistor 23 is then toggled from low to high to low, which causes the photodiode 24 to be charged to the fully depleted photodiode voltage. The SEL signal then goes low. This ends the exposure reset period, discharging the FD node 25 to ground and ensuring that the SF transistor 27 is shut off during the ensuing integration period.

An integration period then commences during which electrical charge created by photons striking the photodiode 24 are integrated over some period of time. After the integration period ends, a sample reset period begins. The sample reset period can be viewed as having four different periods, namely, an FD reset period, a first settle period, a TX period, and a second settle period. During the FD reset period, the FD node 25 is reset. The pixel output line 28 is still high because the Read signal that controls switch 31 is still low, and the Read bar signal that controls switch 32 is still high. The SEL signal then goes high. The reset transistor 21 is now in a conductive state, so that the FD node 25 is charged up through the reset transistor 21 by the SEL signal.

The Read signal then goes high, and so switch 31 is closed and switch 32 is opened. This ends the FD reset period and starts the first settle period, which is the period of time that is needed to allow the pixel output line 28 to settle to its steady state. When the Read signal goes high at the start of the settle period, nodes 27 and 29 are pulled down to a gate-to-source voltage ($V_{gs}$) (SF) below the floating diffusion, corresponding to the reset readout level. The SF transistor 22 is active and the gate-to-source voltage of the reset transistor 21 becomes reverse biased. At this time, terminal 21A of the reset transistor 21 is the source of the transistor 21, and the gate-to-source voltage of the reset transistor 21 is negative. The gate-to-source voltage of the reset transistor 21 is equal in magnitude but opposite in polarity the gate-to-drain voltage of the SF transistor 22. This property keeps the reset transistor 21 off during the remainder of the readout. The SEL signal remains high during the settle period.

Just before the end of the settle period, the voltage on output node 29 is sampled by the S/H circuit. This sample is the reset read sample. The TX signal is then toggled from low to high to low, which causes the charge on the photodiode 24 to be transferred from the photodiode 24 to the FD node 25. The SEL and Read signals remain high, so the reset transistor 21 is inactive and the SF transistor 22 is active. The charge on the photodiode 24 is transferred to the FD node 25.

When the TX signal goes low, the TX period ends and a second settle period begins. During this second settle subperiod, the pixel output line 28 settles to a steady state value corresponding to the video readout level. Just before the end of this second settle period, the S/H circuit samples the value on node 29 of the pixel output line 28. This sample value is referred to herein as the video read sample value. The SEL signal and the Read signal then go low, which ends the sample reset period.

As described above with reference to FIGS. 2 and 3, when both the SEL and Read signals are low, the gate of the reset transistor 21 is at $V_{DD}$, which maintains the reset transistor 21 in the active state, thereby causing the FD node 25 to be connected to a potential sufficiently low enough to keep the source follower transistor 22 in an off condition. Thus, in this state there is no way that the voltage on the FD node 25 can float to a value that will activate the SF transistor 22 and cause the pixel 20 to drive the pixel output line 28. Consequently, the pixel 20 will only drive the pixel output line 28 when the pixel 20 is being specifically addressed.

Figure 4:
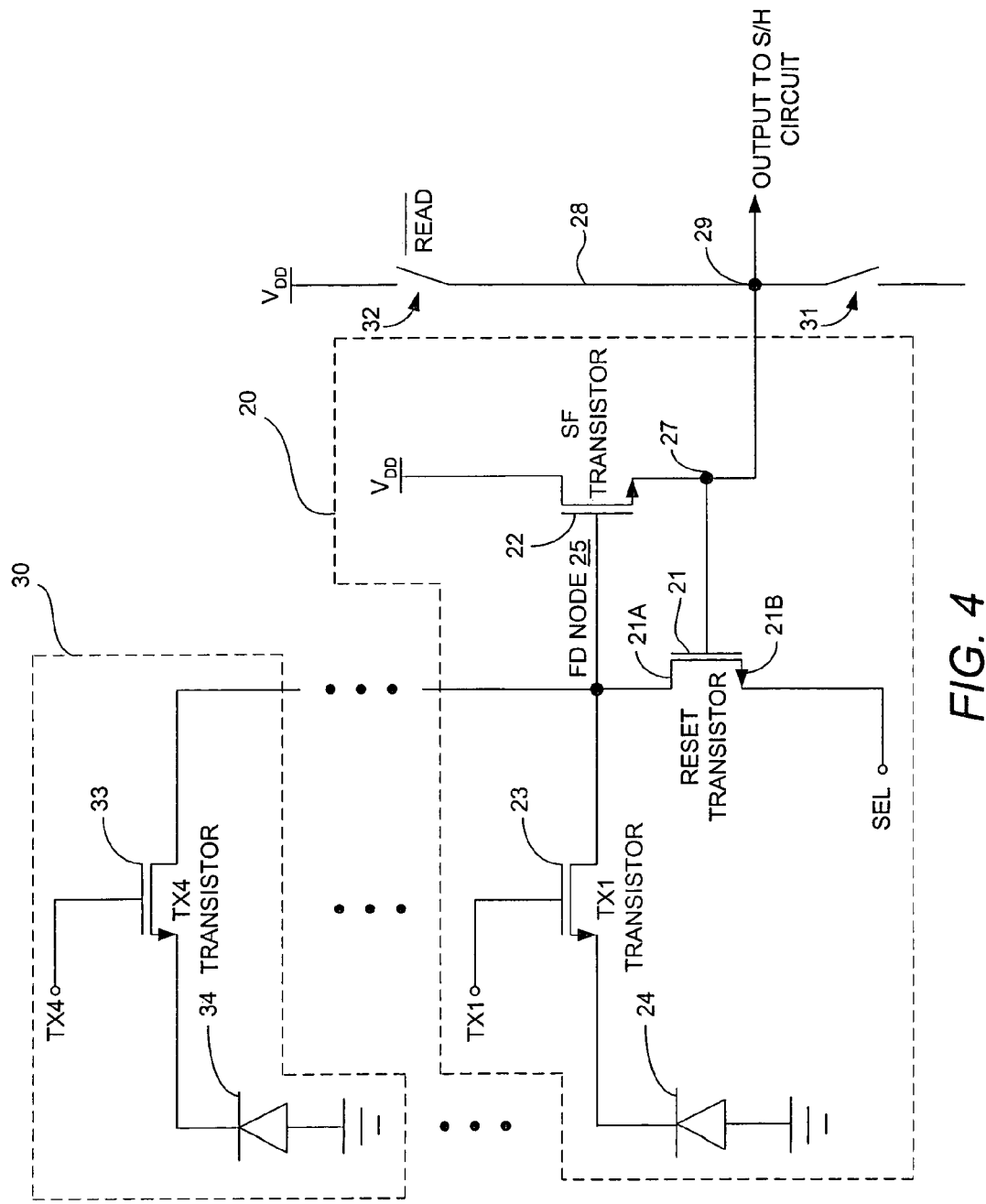
FIG. 4 illustrates a schematic diagram of a 1×4 pixel multiplex group, wherein four photodiodes share the same reset and SF transistors.

FIG. 4 illustrates a schematic diagram of a 1×4 pixel multiplex group, wherein four photodiodes share the same reset and SF transistors 21 and 22, respectively. In this exemplary embodiment, the dashed box 20 corresponds to the pixel 20 shown in FIG. 2. The reset transistor 21 and the SF transistor 22 are shared by three additional pixels, each of which comprises a TX transistor and a photodiode. For ease of illustration, only one of these additional pixels 30 is shown in FIG. 4.

The drains of all of the TX transistors 21-33 are connected to the FD node 25. The Read signal is global (i.e., used for all rows of pixels). Of course VDD and the pixel output line 28 are already shared amongst the group of pixels because they are shared along the column. The pixels operate in the manner described above with reference to FIGS. 2 and 3 except that they are time division multiplexed by selecting only one of the TX signals TX1-TX4 at any given time. When accessing the first row of pixels in the array, the pixel timing operations are executed using TX1 and SEL. For the second row of pixels (not shown), the pixel timing operations are executed using TX2 and SEL. For the third row of pixels (not shown), the pixel timing operations are executed using TX3 and SEL. For the fourth row of pixels, which includes pixel 30, the pixel timing operations are executed using TX4 and SEL.

The configuration shown in FIG. 4 corresponds to one column and four rows of pixels in a multiplex group. However, it should be noted that other configurations may also be used such as, for example, 2×2, 1×6, 2×4, etc. Therefore, the invention is not limited with respect to the size or configuration of the multiplex group.

It should be noted that although the configurations shown in FIGS. 2 and 4 have been described as having particular connections to particular nodes, the invention is not limited in this respect. For example, other elements could be interposed between the connections described above, such as, for example, additional transistors, resistors, etc. The term "electrically coupled" is used herein to described connections that are either direct connections or indirect connections. In addition, the SEL signal has been described as being at ground or nearly ground potential to hold the FD nodes low when the pixels are not being addressed. However, it is not necessary for the SEL signal to be at this potential. Rather, it can be at any potential that will pull the FD nodes low enough to prevent the SF transistors from turning on. Also, while the drain of the SF transistor has been described as being connected to a voltage supply, this is not necessarily the case. For example, the drain of the SF transistor may instead be connected to a current source, or to a voltage source that can be switched between high and low. The term "power supply" is used herein to denote a voltage source, a current source, or any other device that is capable of supplying power.

It should be noted that the invention has been described herein with reference to exemplary embodiments and that the invention is not limited to the embodiments described herein. Those skilled in the art will understand, in view of the description provided herein, the manner in which modifications may be made to the embodiments described herein, and that all such modifications are within the scope of the invention.

What is claimed is:

1. A photodiode device comprising:
a source follower (SF) transistor having first and second terminals and a gate terminal, the first terminal being electrically coupled to a power supply, the second terminal being electrically coupled to a pixel output line, the gate terminal being electrically coupled to a floating diffusion (FD) node;
a reset transistor having a first and second terminals and a gate terminal, the first terminal of the reset transistor being electrically coupled to the FD node, the second terminal of the reset transistor being electrically coupled to a select (SEL) terminal that receives a SEL timing signal, the gate terminal of the reset transistor being directly connected to the pixel output line;
a transfer (TX) transistor having first and second terminals and a gate terminal, the gate terminal of the TX transistor being electrically coupled to a TX terminal that receives a TX timing signal, the first terminal of the TX transistor being electrically coupled to the FD node; and
a photodiode having a cathode terminal and an anode terminal, the cathode terminal being electrically coupled to the second terminal of the TX transistor, the anode terminal being electrically coupled to ground.

2. The photodiode device of claim 1, wherein the photodiode device is a three (3)-transistor (T) buried-gated photodiode device.

3. The photodiode device of claim 1, wherein the photodiode device is incorporated into an array of addressable photodiode devices, and wherein whenever the photodiode device is not being addressed, the SEL timing signal is set to a relatively low voltage potential and the reset transistor is active such that the FD node is effectively electrically coupled to the said relatively low voltage potential.

4. The photodiode device of claim 1, wherein the transistors are metal oxide semiconductor field effect transistors (MOSFETs).

5. The photodiode device of claim 1, further comprising:
a second transfer (TX2) transistor having first and second terminals and a gate terminal, the gate terminal of the TX2 transistor being electrically coupled to a TX2 terminal that receives a TX2 timing signal, the first terminal of the TX2 transistor being electrically coupled to the FD node; and
a second photodiode having a cathode terminal and an anode terminal, the cathode terminal being electrically coupled to the second terminal of the TX2 transistor, the anode terminal being electrically coupled to ground, and wherein the TX1 and TX2 timing signals are time division multiplexed.

6. An integrated circuit (IC) comprising an array of photodiode devices, each photodiode device comprising:
a source follower (SF) transistor having first and second terminals and a gate terminal, the first terminal being electrically coupled to a power supply, the second terminal being electrically coupled to a pixel output line, the gate terminal being electrically coupled to a floating diffusion (FD) node;
a reset transistor having a first and second terminals and a gate terminal, the first terminal of the reset transistor being electrically coupled to the FD node, the second terminal of the reset transistor being electrically coupled to a select (SEL) terminal that receives a SEL timing signal, the gate terminal of the reset transistor being directly connected to the pixel output line;
a transfer (TX) transistor having first and second terminals and a gate terminal, the gate terminal of the TX transistor being electrically coupled to a TX terminal that receives a TX timing signal, the first terminal of the TX transistor being electrically coupled to the FD node; and
a photodiode having a cathode terminal and an anode terminal, the cathode terminal being electrically coupled to the second terminal of the TX transistor, the anode terminal being electrically coupled to ground.

7. The IC of claim 6, wherein the pixel output line includes a Read switch and a Read bar switch, the Read bar switch being turned off when the Read switch is turned on, the Read bar switch being turned on when the Read switch is turned off, the Read bar switch being electrically coupled to a power source, the Read switch being electrically coupled to a current source, wherein the second terminal of the source follower transistor is electrically coupled to the pixel output line at a pixel output node, the pixel output node being located in between the Read switch and the Read bar switch, wherein when the Read bar switch is turned on and the Read switch is turned off, the pixel output node is pulled to a high voltage potential thereby causing the reset transistor activated, and wherein when the Read switch is turned on and the Read bar switch is turned off, the pixel output node outputs either a reset read value or a video read value.

8. The IC of claim 7, wherein when the Read bar switch is turned on, the SEL timing signal is deasserted such that the SEL terminal is at low voltage potential thereby causing the FD node to be pulled down to a low voltage potential.

9. The IC of claim 6, wherein the photodiode devices are three (3)-transistor (T) buried-gated photodiode devices.

10. The IC of claim 6, wherein the transistors are metal oxide semiconductor field effect transistors (MOSFETs).

11. An integrated circuit (IC) comprising an array of photodiode devices, each photodiode device comprising:
a source follower (SF) transistor having first and second terminals and a gate terminal, the first terminal being electrically coupled to a power supply, the second terminal being electrically coupled to a pixel output line, the gate terminal being electrically coupled to a floating diffusion (FD) node;
a reset transistor having a first and second terminals and a gate terminal, the first terminal of the reset transistor being electrically coupled to the FD node, the second terminal of the reset transistor being electrically coupled to a select (SEL) terminal that receives a SEL timing signal, the gate terminal of the reset transistor being directly connected to the pixel output line;
a first transfer (TX1) transistor having first and second terminals and a gate terminal, the gate terminal of the TX1 transistor being electrically coupled to a TX1 terminal that receives a TX1 timing signal, the first terminal of the TX1 transistor being electrically coupled to the FD node;
a photodiode having a cathode terminal and an anode terminal, the cathode terminal being electrically coupled to the second terminal of the TX1 transistor, the anode terminal being electrically coupled to ground;
a second transfer (TX2) transistor having first and second terminals and a gate terminal, the gate terminal of the TX2 transistor being electrically coupled to a TX2 terminal that receives a TX2 timing signal, the first terminal of the TX2 transistor being electrically coupled to the FD node; and
a second photodiode having a cathode terminal and an anode terminal, the cathode terminal being electrically coupled to the second terminal of the TX2 transistor, the anode terminal being electrically coupled to ground, and wherein the TX1 and TX2 timing signals are time division multiplexed.

12. The IC of claim 11, wherein the photodiode devices are three (3)-transistor (T) buried-gated photodiode devices.

13. The IC of claim 11, wherein the transistors are metal oxide semiconductor field effect transistors (MOSFETs).

* * * * *